United States Patent
Hatano et al.

[11] Patent Number: 6,143,585
[45] Date of Patent: Nov. 7, 2000

[54] METHOD OF MANUFACTURING SOLID STATE IMAGE SENSING DEVICE

[75] Inventors: Keisuke Hatano; Yasutaka Nakashiba, both of Tokyo, Japan

[73] Assignee: NEC Corporation, Tokyo, Japan

[21] Appl. No.: 09/109,748

[22] Filed: Jul. 6, 1998

[30] Foreign Application Priority Data

Jul. 4, 1997 [JP] Japan ................................ 9-180087

[51] Int. Cl.[7] ......................... H01L 31/18; H01L 21/70; H01L 27/00
[52] U.S. Cl. ................ 438/69; 438/75; 438/60; 348/294; 348/311; 257/229; 257/230
[58] Field of Search .................... 257/222, 225, 257/226, 233, 257, 258, 292, 229, 230, 232, 223, 435, 234; 438/60, 58, 59, 69, 70, 75, 35, 121, 123, 76, 65; 348/294, 311

[56] References Cited

U.S. PATENT DOCUMENTS

| | | | |
|---|---|---|---|
| 4,914,311 | 4/1990 | Kinoshita et al. | 257/229 |
| 5,264,374 | 11/1993 | Watanabe et al. | 438/69 |
| 5,385,849 | 1/1995 | Nakashiba | 438/60 |
| 5,565,373 | 10/1996 | Nakashiba | 438/75 |
| 5,565,374 | 10/1996 | Fukusho | 438/69 |
| 5,619,049 | 4/1997 | Kim | 257/223 |
| 6,023,293 | 2/2000 | Watanabe et al. | 348/294 |

FOREIGN PATENT DOCUMENTS

| | | |
|---|---|---|
| 62-156861 | 7/1987 | Japan . |
| 6-160897 | 6/1994 | Japan . |
| 7-45676 | 2/1995 | Japan . |
| 8-51196 | 2/1996 | Japan . |

*Primary Examiner*—Matthew Smith
*Assistant Examiner*—Igwe Anya
*Attorney, Agent, or Firm*—Sughrue, Mion, Zinn, Macpeak & Seas, PLLC

[57] ABSTRACT

A solid state image sensing device comprises a cell area, located at a semiconductor substrate, including photoelectric conversion portions and charge transfer portions and a peripheral circuit area formed around the cell area located at the semiconductor substrate. The peripheral circuit area includes a first p[+]-type semiconductor region and an insulating film with a relatively large thickness formed on the first p[+]-type semiconductor region. The cell area further includes a second p[+]-type semiconductor region and an insulating film with a relatively small thickness formed on the second p[+]-type semiconductor region. The majority of the insulating film with the relatively large thickness is formed by means of a CVD process.

6 Claims, 5 Drawing Sheets

METHOD OF MANUFACTURING SOLID STATE IMAGE SENSING DEVICE

BACKGROUND OF THE INVENTION

The present invention relates to a solid state image sensing device and a method of producing such a device.

A solid state image sensing device generally includes a cell area and a peripheral circuit area. The cell area includes photoelectric conversion portions and charge transfer portions. The peripheral circuit area includes a first device isolation region having an insulating film with a relatively large thickness. The cell area includes a second device isolation region including an insulating film with a relative small thickness. The second device isolation region isolates the photoelectric conversion portions from each other, the photoelectric conversion portions from the charge transfer portions, and the charge transfer portions from each other.

In conventional techniques, the first and the second device isolation regions are generally formed by different processes, as disclosed for example in Japanese Unexamined Patent Publication No. 156861/1987 (Tokkai Sho 62-156861).

In the conventional solid state image sensing devices, a voltage as high as 15V is applied to the peripheral circuit area. To achieve good electrical isolation for such a peripheral circuit area, it is required that the impurity concentration in the first device isolation region should be sufficiently high. The first device isolation region is formed under an insulating film with a relatively large thickness. Therefore, the ion implantation process for introducing impurities to form the first device isolation region is required to be performed before the LOCOS (Local Oxidation of Silicon) process for forming the insulating film with the relatively large thickness. The process for forming the insulating film with the relatively large thickness causes a junction of p+ type-impurity in the first device isolation region to become deeper. Thus, it is possible to obtain sufficient device isolation characteristic under the high applied voltage condition.

On the other hand, the voltage applied to the cell area is lower than that applied to the peripheral circuit area. Therefore, the impurity concentration of the second device isolation region in the cell area can be lower than that of the device isolation region of the peripheral circuit area. On the other hand, it is not required to form an insulating film with a relatively large thickness on the second device isolation region. Therefore, the process of forming the second device isolation region of the cell area is performed separately from the process of forming the first device isolation region in the peripheral circuit area. More specifically, the amount of impurity doped to form the device isolation region in the cell area is selected to be low enough to suppress the expansion of the second device isolation region thereby increasing the photoelectric conversion portions and the charge transfer portions thus enhancing the sensitivity and increasing the charge transfer capacity.

The LOCOS process for forming the insulating film with the relatively large thickness in the peripheral circuit area includes a thermal oxidation process. The thermal oxidation process needs a long processing time. In the conventional technique of producing solid state image sensing devices, such a long-time thermal-oxidation process causes a thermal stress that results crystal defects that act as cites where undesirable charges are generated. As a result, the solid state image sensing devices produced by the conventional technique have a large number of defects called white dots.

Another disadvantage of the conventional technique of producing solid state image sensing devices is that a large number of processing steps are required because the first device isolation region in the peripheral circuit area and the second device isolation region in the cell area are formed in different process steps.

SUMMARY OF THE INVENTION

In view of the above, it is an object of the present invention to provide a solid state image sensing device including a reduced number of white dot defects caused by a long-time heat treatment in a production process.

Another object of the present invention is to provide a method of producing such a solid state image sensing device, requiring a small number of processing steps.

These and other objects, features, and advantages of the present invention will become clear as the following description proceeds.

According to an aspect of the present invention, there is provided a solid state image sensing device comprising a cell area located at a semiconductor substrate and a peripheral circuit area formed around the cell area located at the semiconductor substrate. The cell area includes photoelectric conversion portions and charge transfer portions. The peripheral circuit area includes a first device isolation region and an insulating film with a relatively large thickness formed on the first device isolation region. The cell area includes a second device isolation region by which isolation is made between photoelectric conversion portions themselves, between photoelectric conversion portions and charge transfer portions, and between charge transfer portions themselves. The cell area further includes an insulating film with a relatively small thickness formed on the second device isolation region The solid state image sensing device is characterized in that the majority part of the insulating films with the relatively large thickness is formed by means of a CVD (chemical vapor deposition) process.

According to another aspect of the present invention, there is provided a method of producing a solid state image sensing device. The solid state image sensing device comprises a cell area located at a semiconductor substrate and a peripheral circuit area formed around the cell area located at the semiconductor substrate, the cell area including photoelectric conversion portions and charge transfer portions. The method comprises the steps of: forming the peripheral circuit area, the step of forming the peripheral circuit area including the steps of forming a first device isolation region and forming an insulating film with a relatively large thickness on the first device isolation region; forming the cell area, the step of forming the cell area including the steps of forming a second device isolation region by which isolation is made between photoelectric conversion portions themselves, between photo-electric conversion portions and charge transfer portions, and between charge transfer portions themselves and also forming an insulating film with a relatively small thickness on the second device isolation region, the method being characterized in that in the step of forming the insulating film with the relatively large thickness, the insulating film with the relatively large thickness is formed mainly by means of a CVD process.

DESCRIPTION OF THE PREFERRED EMBODIMENTS

To facilitate better understanding of the present invention, a conventional solid state image sensing device and the process of producing it is first described with reference to FIGS. 1A to 1D. In FIGS. 1A to 1D, a peripheral circuit area is shown on the side to the left and a cell area is shown on the side to the right of the alternate long and short dash line.

Figure 1A:
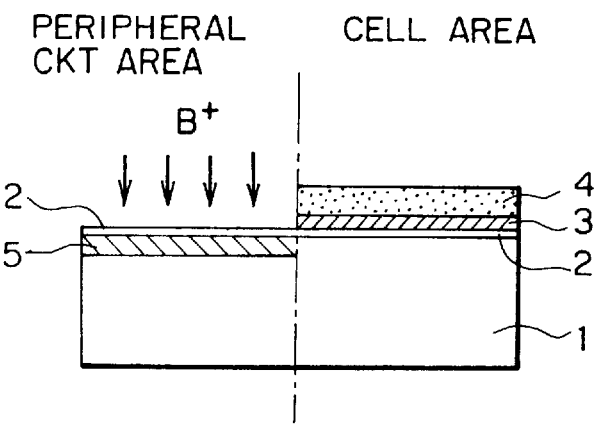
FIGS. 1A to 1D are longitudinal sectional views of a part of solid state image sensing device, illustrating a method of producing a solid state image sensing device according to a conventional technique.

Referring first to FIG. 1A, an insulating film 2 serving as a insulating film and a nitride film 3 are formed on a p-type semiconductor substrate 1. The insulating film 2 and the nitride film 3 are etched through a photoresist 4 serving as an etching mask formed in particular areas by means of photolithography. Furthermore, for example boron is implanted into the semiconductor substrate 1 using the photoresist 4, the nitride film 3, and the insulating film 2 as a mask, thereby forming a first $p^+$-type semiconductor region 5 which serves as a first device isolation region in the peripheral circuit area when the device is completely formed.

Figure 1B:
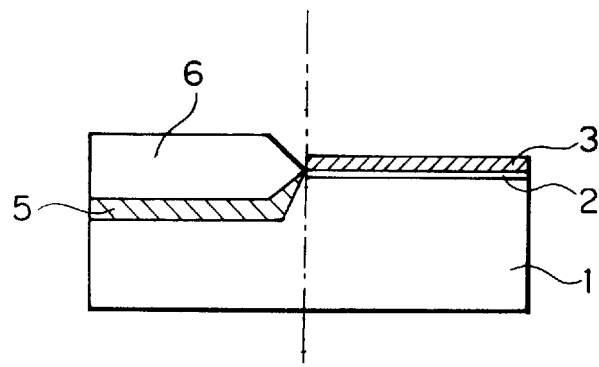

In FIG. 1B, the photoresist 4 is removed and then thermal oxide is performed so as to form an insulating film 6 with a relatively large thickness such as 800 nm selectively only in the peripheral circuit area.

Figure 1C:
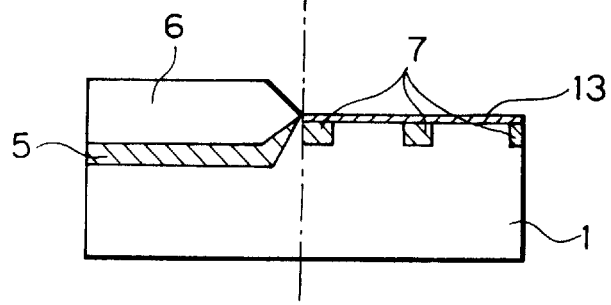

In FIG. 1C, the nitride film 3 and the insulating film 2 are successively removed. Thermal oxidation is again performed to form an insulating film 13. An impurity (such as boron) that causes the same type conductivity as the p-type semiconductor substrate 1 is introduced into the substrate 1 by means of ion implantation in conjunction with photolithography thereby forming second $p^+$-type semiconductor regions 7 that serve, when the device is completely formed, as the second device isolation region for isolation between photoelectric conversion portions themselves, between the photoelectric conversion portions and the charge transfer portions, and between the charge transfer portions themselves in the cell area.

Figure 1D:
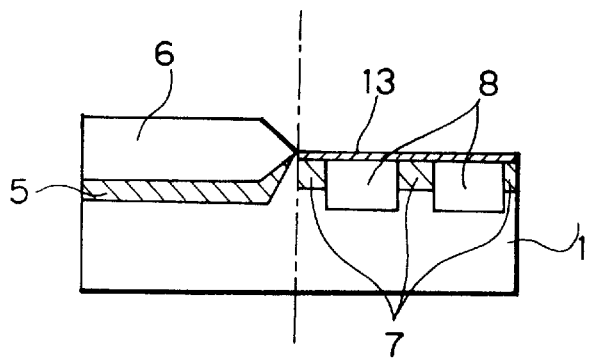

In FIG. 1D, impurities (such as phosphorus) that cause an opposite type conductivity to that of the p-type semiconductor substrate 1 are implanted to form photoelectric conversion portions 8 and charge transfer portions (not shown).

After that, electrodes for transferring signal charges, an interlayer insulating film, and other elements are formed. Thus, a solid state image sensing device in a complete form is obtained.

In the conventional solid state image sensing device, as described above, because a voltage as high as 15V is applied to the peripheral circuit area, the impurity concentration of the first device isolation region is required to be sufficiently high to achieve good enough isolation. The first device isolation region is formed under the insulating film with the relatively large thickness and thus the ion implantation process used to form the first device isolation region has to be performed before the insulating film with the relatively large thickness is formed by the LOCOS process. However, the $p^+$-type impurity junction of the first device isolation region is shifted to a deeper position during the LOCOS process for forming the insulating film with the relatively large thickness. As a result, device isolation characteristic of the first device isolation region under the high voltage condition becomes high.

On the other hand, the voltage applied to the cell area is lower than that applied to the peripheral circuit area. Therefore, the impurity concentration of the second device isolation region of the cell area can be lower than that of the device isolation region in the peripheral circuit area. Furthermore, it is not required to form an insulating film with a relatively large thickness on the second device isolation region. For the above reason, the process of forming the second device isolation region of the cell area is performed separately from the process of forming the first device isolation region in the peripheral circuit area. More specifically, the amount of impurity doped to form the device isolation region of the cell area is selected to be low enough to suppress the expansion of the second device isolation region. Thus, the photoelectric conversion portions and the charge transfer portions enhance the sensitivity and increase the charge transfer capacity.

The LOCOS technique for forming the insulating film with the relatively large thickness in the peripheral circuit area includes a thermal oxidation process which needs a long processing time.

First Embodiment

Figure 2A:
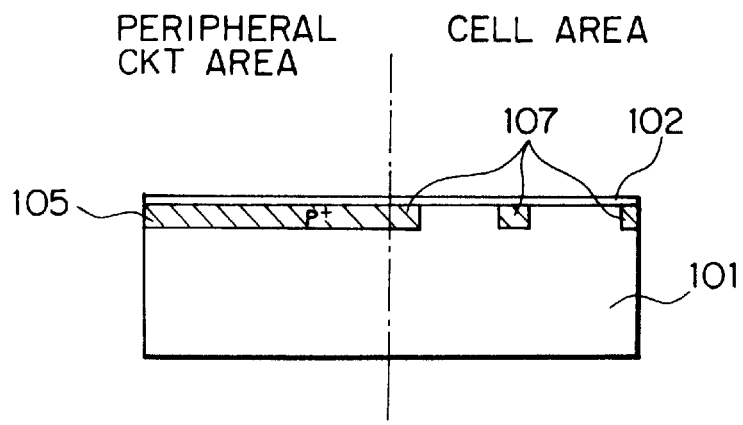
FIGS. 2A to 2C are longitudinal sectional views of a part of a solid state image sensing device, illustrating a method of producing a solid state image sensing device according to a first embodiment of the invention.
Figure 2B:
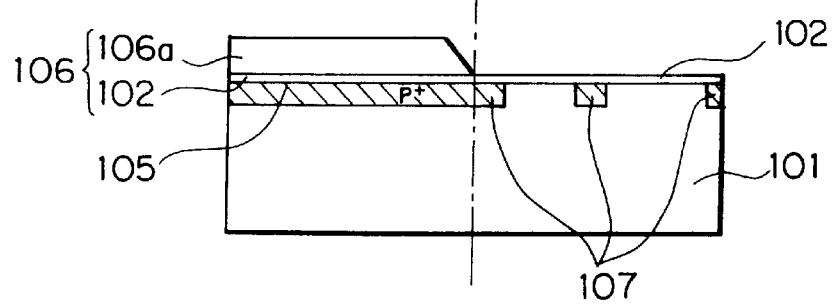
Figure 2C:
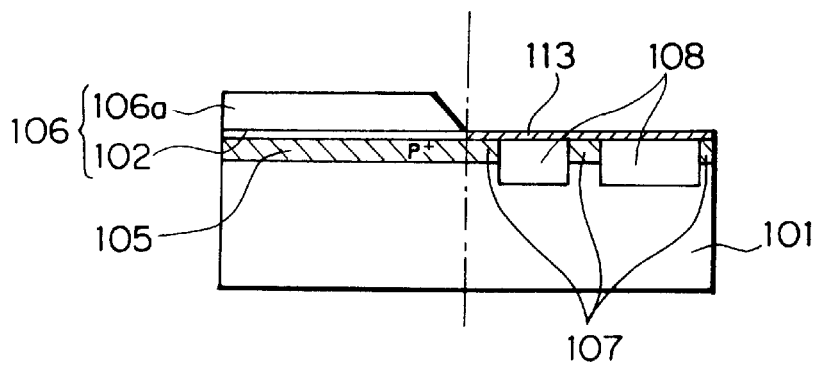

Referring now to FIGS. 2A to 2C, a solid state image sensing device and the method of producing it according to a first embodiment of the invention are described below. In FIGS. 2A to 2C, a peripheral circuit area is shown on the side to the left and a cell area is shown on the side to the right of the alternate long and short dash line.

Referring first to FIG. 2A, a first insulating film 102 with a thickness of about 20 nm is formed by means of thermal oxidation on a p-type semiconductor substrate 101. An impurity (such as boron) that causes the same type conductivity as that of the p-type semiconductor substrate 101 is introduced into the semiconductor substrate 101 by means of ion implantation at an energy of 150 KeV and at a dose of $1 \times 10^{13}$ ions/cm$^2$. Thus, a $p^+$-type semiconductor region 105 of a first device isolation region in the peripheral circuit area and a $p^+$-type semiconductor region 107 of a second device isolation region for isolation between photoelectric conversion portions and charge transfer portions in the cell area are simultaneously formed.

In FIG. 2B, an insulating film with a thickness of about 600 nm is formed by means of CVD over the entire surface of the semiconductor substrate 101. After that, the device is subjected to a heat treatment at a temperature higher than that at which the CVD process was performed. The insulating film in the invented areas is then removed by means of wet etching in conjunction with photolithography. Thus, a second insulating film 106a is formed in the peripheral circuit area. In the peripheral circuit area, the first and the second insulating films 102 and 106a serve as an insulating film 106 with a relatively large thickness.

In FIG. 2C, the first insulating film 102 in the cell area is removed and then thermal oxidation is again performed to form an insulating film 113. An impurity that causes an opposite type conductivity to that of the p-type semiconductor substrate 101 is introduced into the semiconductor substrate 101 by means of ion implantation at an energy of 150 KeV and at a dose of 1×10$^{12}$ ions/cm$^2$ in conjunction with photolithography. Thus, photoelectric conversion portions 108 are formed. The impurity employed herein may be arsenic.

After that, electrodes for transferring signal charges, an interlayer insulating film, and other elements are formed. Thus, a solid state image sensing device in a complete form is obtained.

In the method of producing the solid state image sensing device according to the first embodiment of the invention, the insulating film 106 is formed by means of CVD except the first insulating film 102. This means that the majority part, in thickness direction, of the insulating film 106 is formed by means of CVD. Because the majority part of the insulating film 106 with the relatively large thickness is formed in the peripheral circuit area by means of CVD without using a thermal oxidation process that needs a long processing time, white dot defects, which would otherwise be generated by the long-time heat treatment, are suppressed. Furthermore, because the p$^+$-type regions are formed at the same time in both the first deice isolation region (105) in the peripheral circuit area and the second device isolation region (107) in the cell area, the processing steps are reduced compared to the process of producing the solid state image sensing device according to the conventional technique. Furthermore, because the thermal oxidation process is not used to form the insulating film 106 with the relatively large thickness in the peripheral circuit area, substantially no expansion occurs in the p$^+$-type semiconductor region of the second device isolation region (107) in the cell area. As a result, a larger area can be used for pixels and thus a higher sensitivity can be achieved.

Second Embodiment

Referring now to FIGS. 3A to 3E, a solid state image sensing device and the method of producing it according to a second embodiment of the invention are described below.

Figure 3A:
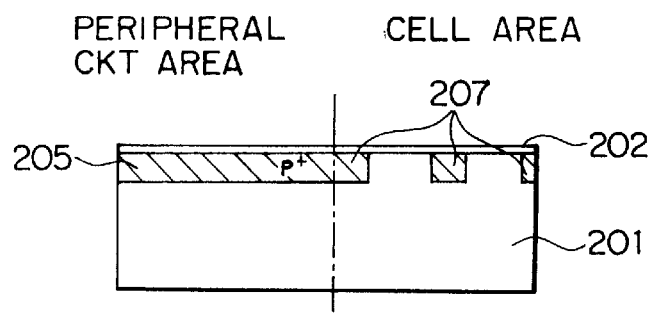
FIGS. 3A to 3E are longitudinal sectional views of a part of a solid state image sensing device illustrating a method of producing a solid state image sensing device according to a second embodiment of the invention.

Referring first to FIG. 3A, a first insulating film 202 with a thickness of about 20 nm is formed on a p-type semiconductor substrate 201. An impurity (such as boron) that causes the same type conductivity as that of the p-type semiconductor substrate 201 is introduced into the semiconductor substrate 201 by means of ion implantation at an energy of 150 KeV and at a dose of 1×10$^{13}$ ions/cm$^2$ thereby simultaneously forming a p$^+$-type semiconductor region 205 of a first device isolation region in the peripheral circuit area and a p$^+$-type semiconductor region 207 of a second device isolation region for isolation between photoelectric conversion portions and charge transfer portions in the cell area.

Figure 3B:
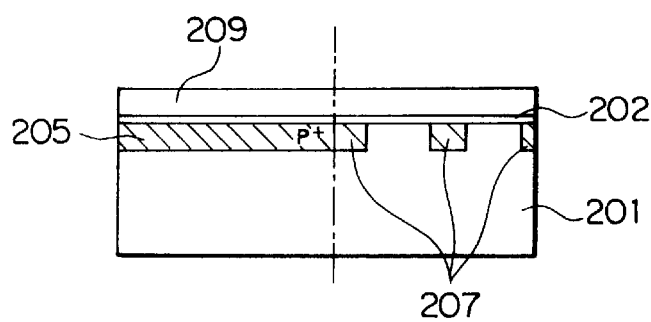

In FIG. 3B, an insulating film with a thickness of about 500 nm is formed by means of CVD over the entire surface of the device. After that, the device is subjected to a heat treatment at a temperature higher than that at which the CVD process was performed. Thus a first CVD layer 209 is obtained.

Figure 3C:
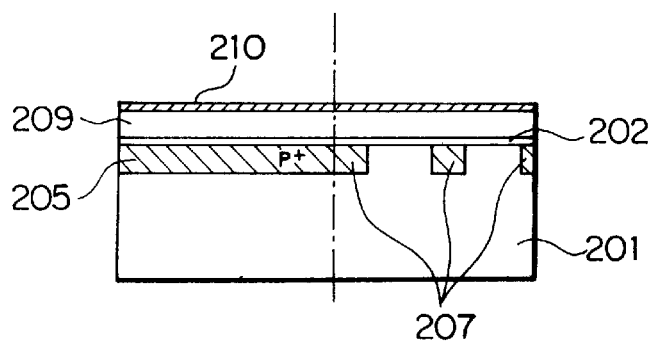

In FIG. 3C, an insulating film with a thickness of about 100 nm is then formed by means of CVD thereby forming a second CVD layer 210 on the first CVD layer 209.

Figure 3D:
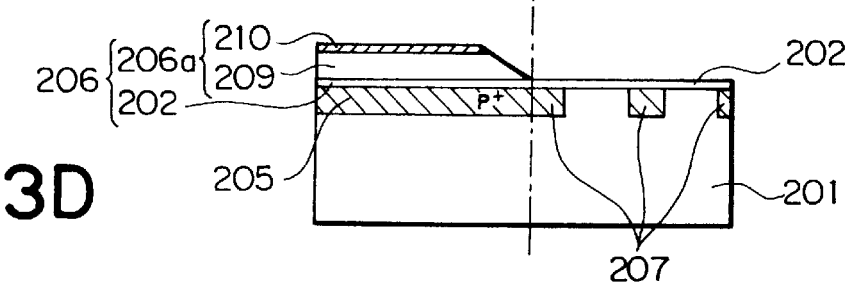

In FIG. 3D, a multilayer film consisting of the first CVD layer 209 and the second CVD layer 210 in unwanted areas is removed by means of wet etching in conjunction with photolithography. In the peripheral circuit area, the multilayer film consisting of the first and the second CVD layers 209 and 210 serve as a second insulating film 206a.

Furthermore, the first and the second insulating films 202 and 206a serve as an insulating film 206 with a relatively large thickness. Thus, the insulating film 206 with a relatively large thickness is formed in the peripheral circuit area.

Figure 3E:
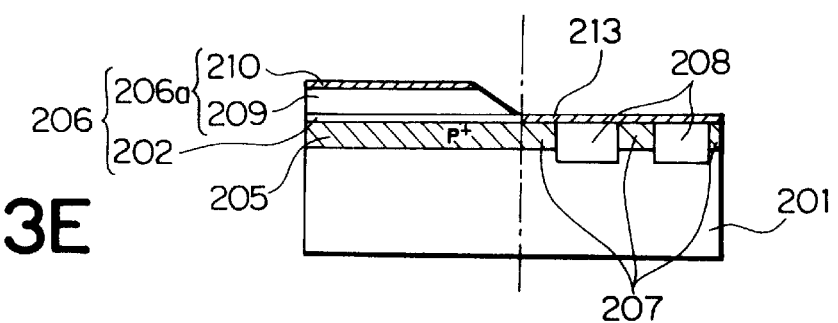

In FIG. 3E, the first insulating film 202 in the cell area is removed and then thermal oxidation is again performed to form an insulating film 213. An impurity that causes an opposite type conductivity to that of the p-type semiconductor substrate 201 is introduced into the semiconductor substrate 201 by means of ion implantation at an energy of 150 KeV and at a dose of 1×10$^{12}$ ions/cm$^2$ in conjunction with photolithography. Thus, photoelectric conversion portions 208 are formed. The impurity employed herein may be arsenic.

After that, electrodes for transferring signal charges, an interlayer insulating film, and other elements are formed. Thus a solid state image sensing device in a complete form is obtained.

In the solid state image sensing device according to the second embodiment of the invention, the second insulating film 206a is obtained in the peripheral circuit area by forming the multilayer film consisting of the first CVD layer 209 subjected to the heat treatment and the second CVD layer 210 subjected to no heat treatment. In this technique, when the multilayer film is patterned by means of wet etching, the multilayer film is etched in a lateral direction to a large extent in part near its surface. As a result, the etched edge of the second insulating film 206a with the relatively large thickness in the peripheral circuit area has a tapered shape. This prevents the wiring from being broken at the edge of the insulating film 206 with the relatively large thickness in the peripheral circuit area and thus coverage is improved. Furthermore, a short circuit between adjacent wires due to insufficient etching can be prevented.

Third Embodiment

Referring now to FIGS. 4A to 4E, a solid state image sensing device and the method of producing it according to a third embodiment of the invention are described below.

Figure 4A:
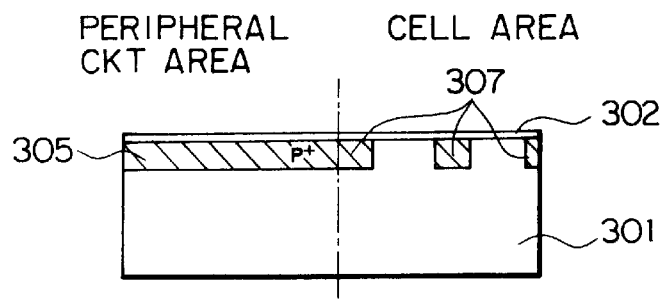
FIGS. 4A to 4E are longitudinal sectional views of a part of a solid state image sensing device, illustrating a method of producing a solid state image sensing device according to a third embodiment of the invention.

Referring first to FIG. 4A, a first insulating film 302 with a thickness of about 20 nm is formed on a p-type semiconductor substrate 301. An impurity (such as boron) that causes the same type conductivity as that of the p-type semiconductor substrate 301 is introduced into the semiconductor substrate 301 by means of ion implantation at an energy of 150 KeV and at a dose of 1×10$^{13}$ ions/cm$^2$. Thus, a p$^+$-type semiconductor region 350 of a first device isolation region in the peripheral circuit area and a p$^+$-type semiconductor region 307 of a second device isolation region for isolation between photoelectric conversion portions and charge transfer portions in the cell area are formed simultaneously.

Figure 4B:
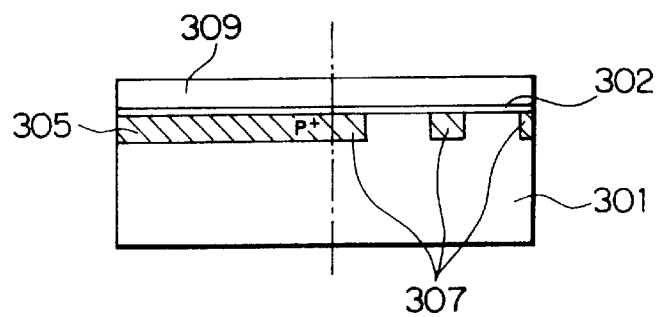

In FIG. 4B, an insulating film with a thickness of about 600 nm is formed by means of CVD over the entire surface of the device thereby forming a CVD layer 309. After that, the device is subjected to a heat treatment at a temperature higher than that at which the CVD process was performed.

Figure 4C:
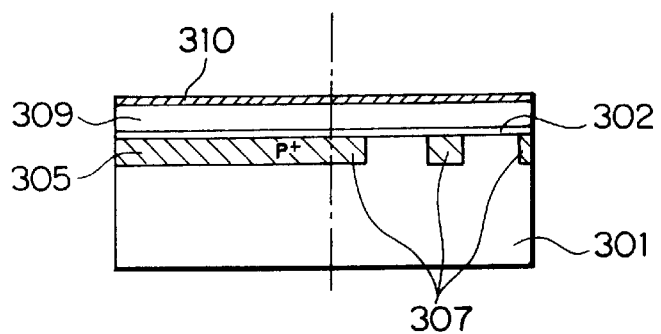

In FIG. 4C, arsenic is implanted at an energy of for example 70 KeV and a dose of 1×10$^{15}$ ions/cm$^2$ so as to form an arsenic-implanted layer 310. Herein, phosphorus may be employed instead of arsenic.

Figure 4D:
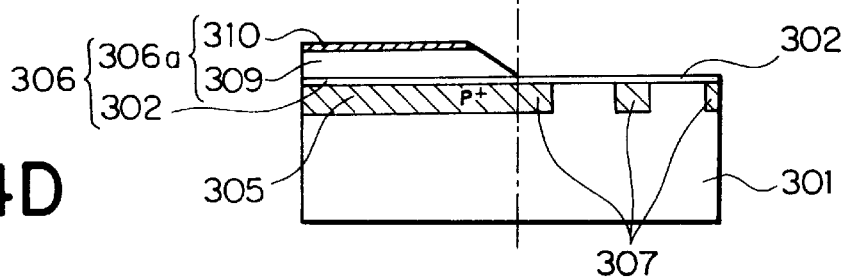

In FIG. 4D, the CVD layer 309 and the arsenic-implanted layer 310 is unwanted areas are removed by means of wet etching in conjunction with photolithography. In the peripheral circuit area, the CVD layer 309 and the arsenic-implanted layer 310 serve as a second insulating film 306a. Furthermore, the first and the second insulating films 302 and 306a serve as an insulating film 306 with a relatively large thickness. Thus, the insulating film 306 with a relatively large thickness is formed in the peripheral circuit area.

Figure 4E:
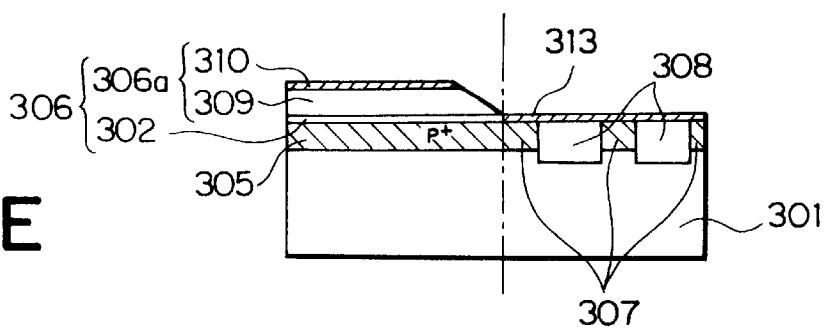

In FIG. 4E, the first insulating film 302 in the cell area is removed and then thermal oxidation is again performed to form an insulating film 313. An impurity that causes an opposite type conductivity to that of the p-type semiconductor substrate 301 is introduced into the semiconductor substrate 301 by means of ion implantation at an energy of 150 KeV and at a dose of $1\times10^{12}$ ions/cm$^2$ in conjunction with photolithography. Thus, photoelectric conversion portions 308 are formed. The impurity employed herein may be arsenic.

After that, electrodes for transferring signal charges, an interlayer insulating film, and other elements are formed. Thus, a solid state image sensing device in a complete form is obtained.

In the solid state image sensing device according to the third embodiment of the invention, because the second insulating film 306a is realized with the CVD insulating film (309) having the surface (310) doped with arsenic or phosphorus by means of ion implantation, the surface of the film exhibits a high etching rate. As a result, when the second insulating film 306a in the peripheral circuit area is patterned by means of wet etching, the surface (310) is etched in a lateral direction to a large extent in part near its surface. Thus, the etched edge of the second insulating film 306a in the peripheral circuit area has a tapered shape. This prevents the wiring from being broken at the edge of the insulating film 306 with the relatively large thickness in the peripheral circuit area and thus coverage is improved. Furthermore, a short circuit between adjacent wires due to insufficient etching can be prevented.

Fourth Embodiment

Referring now to FIGS. 5A to 5D, a solid state image sensing device and the method of producing it according to a fourth embodiment of the invention are described below.

Figure 5A:
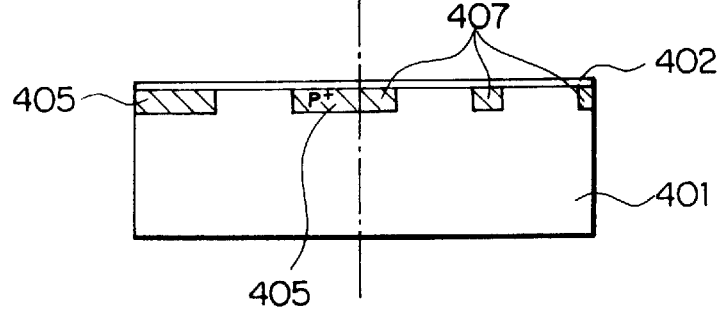
FIGS. 5A to 5D are longitudinal sectional views of a part of a solid state image sensing device, illustrating a method of producing a solid state image sensing device according to a fourth embodiment of the invention.

Referring first to FIG. 5A, a first insulating film 402 with a thickness of about 20 nm is formed on a p-type semiconductor substrate 401. An impurity (such as boron) that causes the same type conductivity as that of the p-type semiconductor 401 is introduced into the semiconductor substrate 401 by means of ion implantation at an energy of 150 KeV and at a dose of $1\times10^{13}$ ions/cm$^2$. Thus, a p$^+$-type semiconductor region 405 of a first device isolation region in the peripheral circuit area and a p$^+$-type semiconductor region 407 of a second device isolation region are simultaneously formed.

In this embodiment, the first p$^+$-type semiconductor region 405 of the first device isolation region in the peripheral circuit area is formed in part of the region where an insulating film with a relatively large thickness will be formed later so that there is no first p$^+$-type semiconductor region 405 below metal wiring will be formed on the insulating film with the relatively large thickness.

Figure 5B:
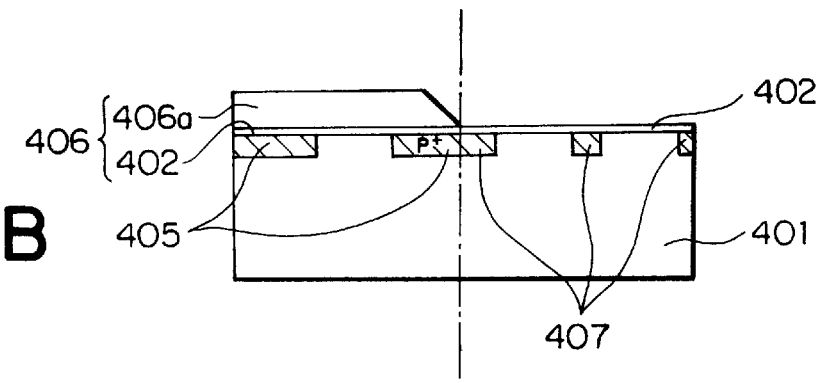

In FIG. 5B, an insulating film with a thickness of about 600 nm is formed by means of CVD over the entire surface of the device. After that, the device is subjected to a heat treatment at a temperature higher than that at which the CVD process was performed. Thus, a CVD layer is obtained. The CVD layer is unwanted areas is then removed by means of etching. In the peripheral circuit area, a remaining CVD layer serves as a second insulating film 406a. Furthermore, the first and the second insulating films 402 and 406a serve as an insulating film 406 with a relatively large thickness. Thus, the insulating film 406 with the relatively large thickness is formed in the peripheral circuit area.

Figure 5C:
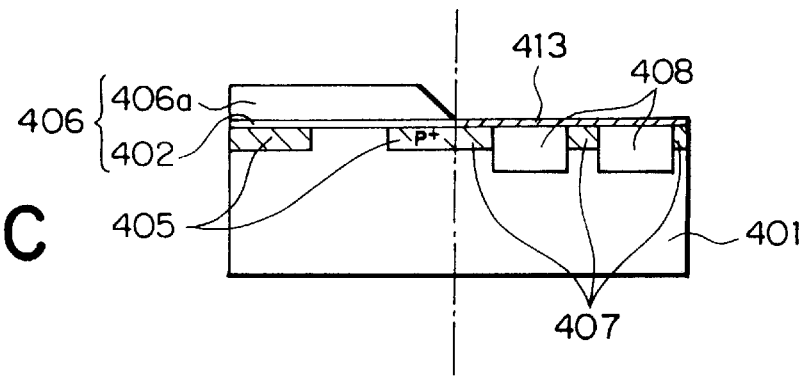

In FIG. 5C, the first insulating film 402 in the cell area is removed and then thermal oxidation is again performed to form an insulating film 413. After that, an impurity that causes an opposite type conductivity to that of the p-type semiconductor substrate 401 is introduced into the semiconductor substrate 401 by means of ion implantation at an energy of 150 KeV and at a dose of $1\times10^{12}$ ions/cm$^2$ in conjunction with photolithography. Thus, photoelectric conversion portions 408 are formed. The impurity employed herein may be arsenic.

Figure 5D:
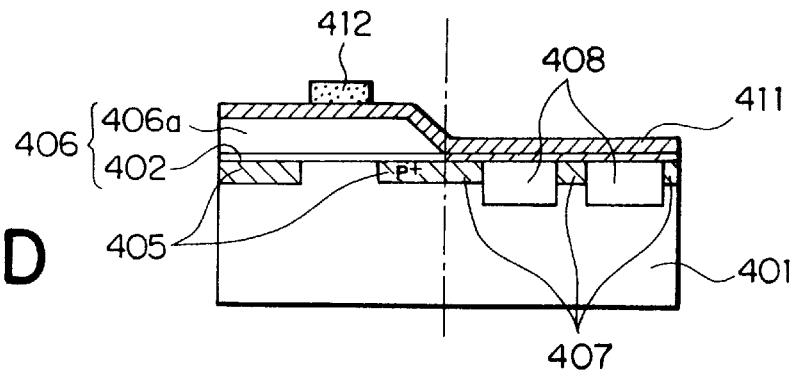

In FIG. 5D, after forming an interlayer insulating film 411, a wiring 412 is formed on the insulating film 406 with the relatively large thickness in the peripheral circuit area in such a manner that the wiring 412 is located above the region where the first p$^+$-type semiconductor region 405 is not formed. The wiring 412 may be formed of refractory metal or polycrystal.

In the fourth embodiment of the invention, because there is no first p$^+$-type semiconductor region 405 below the wiring 412 in the peripheral circuit area, the surface of the p-type semiconductor substrate 401 in the area below the wiring 412 is depleted when a voltage is applied to the wiring 412. This allows a reduction in the capacitance associated with the wiring. In particular when this structure is applied to bus wiring, the delay of pulses is suppressed. Furthermore, when the structure is applied to wiring extending between stray diffusion layers and an output circuit, the stray diffusion capacitance is reduced and thus device characteristics are improved.

In the first to fourth embodiments described above, the p-type semiconductor substrate is employed. However, the invention may also be applied to an n-type semiconductor substrate if the conduction types of various portions are inverted.

What is claimed is:

1. A method of producing a solid state sensing device, said solid state image sensing device comprising a cell area located at a semiconductor substrate and a peripheral circuit area formed around the cell area located at the semiconductor substrate, said cell area including photoelectric conversion portions and charge transfer portions, said method comprising the steps of:

forming said peripheral circuit area, said step of forming the peripheral circuit area including the steps of forming a first device isolation region and forming an insulating film on said first device isolation region;

forming said cell area, said step of forming the cell area including the steps of forming a second device isolation region for making isolation between said photoelectric conversion portions themselves, between said photoelectric conversion portions and said charge transfer portions, and between said charge transfer portions themselves and forming an insulating film on said second device isolation region;

wherein said insulating film of said peripheral circuit area is formed to have a thickness greater than the thickness of said insulating film of said cell area and is formed using a CVD process.

2. A method of producing a solid state image sensing device as claimed in claim 1, wherein the step of forming said insulating film of said peripheral circuit area includes the steps of forming a first insulating film by thermally oxidizing a semiconductor substrate and forming a second insulating film on said first insulating film by means of a CVD process.

3. A method of producing a solid state image sensing device as claimed in claim 2, wherein the step of forming said second insulating film includes the steps of:

forming a first CVD layer by means of forming an insulating film, by means of the CVD process, and then performing a heat treatment on said insulating film at a temperature higher than a growth temperature employed in the CVD process; and forming a second CVD layer by means of the CVD process on said first CVD layer.

4. A method of producing a solid state image sensing device as claimed in claim 2, wherein the step of forming said second insulating film includes the steps of:

forming a CVD layer by means of forming an insulating film, by means of the CVD process, and then performing a heat treatment on said insulating film at a temperature higher than a growth temperature employed in the CVD process; and forming a high etching rate layer by means of implanting arsenic or phosphorus into a surface region of said CVD layer.

5. A method of producing a solid state image sensing device as claimed in claim 1 further comprising the steps of:

forming said first device isolation region in a partial fashion; and forming a wiring above said insulating film of said peripheral circuit area so as to be located above where said first device isolation region is not formed.

6. A method of producing a solid state image sensing device as claimed in claim 1, wherein said first and said second device isolation regions are formed in the same step.

* * * * *

UNITED STATES PATENT AND TRADEMARK OFFICE
CERTIFICATE OF CORRECTION

PATENT NO. : 6,143,585
DATED : November 07, 2000
INVENTOR(S) : Keisuke HATANO, Yasutaka NAKASHIBA It is certified that error appears in the above-identified patent and that said Letters Patent is hereby corrected as shown below:

Column 6, line 47, delete "350" insert --305--

Column 8, line 57, after "CVD" insert --(chemical vapor deposition)--

Signed and Sealed this

Twenty-second Day of May, 2001

Attest:

NICHOLAS P. GODICI

Attesting Officer

Acting Director of the United States Patent and Trademark Office